(12) United States Patent  
Carvalho

(10) Patent No.: US 9,880,199 B2  
(45) Date of Patent: Jan. 30, 2018

(54) PROBE ALIGNMENT CONNECTION DEVICE

(71) Applicant: Teradyne, Inc., North Reading, MA (US)

(72) Inventor: Valquirio N. Carvalho, Lowell, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 14/464,852

(22) Filed: Aug. 21, 2014

(65) Prior Publication Data

US 2016/0054356 A1    Feb. 25, 2016

(51) Int. Cl.  
*G01R 1/067* (2006.01)  
*G01R 1/073* (2006.01)  
*G01R 31/28* (2006.01)

(52) U.S. Cl.  
CPC ..... *G01R 1/06794* (2013.01); *G01R 1/07342* (2013.01); *G01R 31/2844* (2013.01)

(58) Field of Classification Search  
None  
See application file for complete search history.

(56) References Cited

U.S. PATENT DOCUMENTS

| | | | |
|---|---|---|---|
| 6,292,003 B1 | 9/2001 | Fredrickson et al. | |
| 6,580,283 B1 * | 6/2003 | Carbone | G01R 31/2886 324/750.05 |
| 7,118,393 B1 * | 10/2006 | Pupkiewicz | H01R 13/2414 439/66 |
| 7,445,503 B1 | 11/2008 | Zhang et al. | |
| 7,952,373 B2 * | 5/2011 | Mok | G01R 1/07342 324/750.24 |
| 2003/0107388 A1 | 6/2003 | Reed et al. | |
| 2004/0201392 A1 * | 10/2004 | Kim | G01R 1/06744 324/750.23 |
| 2008/0180122 A1 * | 7/2008 | Soubh | G01R 1/06733 324/754.09 |
| 2008/0305689 A1 * | 12/2008 | Zhang | H01R 12/716 439/638 |
| 2009/0156060 A1 * | 6/2009 | Hunkins | H01R 12/712 439/638 |

(Continued)

OTHER PUBLICATIONS 0.4 mm Contact Pitch, Stacking Height 0.8 mm Board-to-Board/Board-to-FPC Connector, BM20 Series, 12 pages, 2012.

(Continued)

*Primary Examiner* — Jermele M Hollington  
*Assistant Examiner* — Douglas X Rodriguez  
(74) *Attorney, Agent, or Firm* — Choate, Hall & Stewart LLP

(57) ABSTRACT

A probe for automatic test equipment (ATE) includes: an outer shroud including a course alignment feature configured to receive a target device and to guide the target device into an interior of the outer shroud, where the target device includes exposed electrical leads; and an inner structure that is at least partly inside the outer shroud. The inner structure includes electrical contacts for making an electrical connection to the exposed electrical leads, and also includes a fine alignment feature configured to guide the target device towards the electrical contacts to make the electrical connection.

21 Claims, 7 Drawing Sheets

(56) References Cited

U.S. PATENT DOCUMENTS

| | | |
|---|---|---|
| 2009/0163050 A1 | 6/2009 | Fang et al. |
| 2010/0105249 A1* | 4/2010 | Bandhu .............. H01R 13/6271 |
| | | 439/638 |
| 2014/0120777 A1 | 5/2014 | Rinder et al. |
| 2014/0134887 A1* | 5/2014 | Soubh .................. H01R 12/724 |
| | | 439/638 |

OTHER PUBLICATIONS

International Search Report and Written Opinion mailed Nov. 26, 2015 in international application No. PCT/US2015/045875, 14 pgs.
International Preliminary Report on Patentability for PCT/US2015/045875, 10 pages (dated Feb. 21, 2017).

\* cited by examiner

PROBE ALIGNMENT CONNECTION DEVICE

TECHNICAL FIELD

This specification relates generally to probe alignment in automatic test equipment.

BACKGROUND

Automatic Test Equipment (ATE) refers to an automated, usually computer-driven, system for testing devices. A device tested by ATE is generally referred to as a device under test (DUT). ATE typically includes a computer system and a test instrument or a single device having corresponding functionality. ATE is capable of providing test signals to a DUT, receiving response signals from the DUT, and forwarding those response signals for processing to determine whether the DUT meets testing qualifications.

SUMMARY

An example probe for automatic test equipment (ATE) may comprise: an outer shroud comprising a course alignment feature configured to receive a target device and to guide the target device into an interior of the outer shroud, where the target device includes exposed electrical leads; and an inner structure that is at least partly inside the outer shroud. The inner structure comprises electrical contacts for making an electrical connection to the exposed electrical leads, and also comprises a fine alignment feature configured to guide the target device towards the electrical contacts to make the electrical connection. The example probe may include one or more of the following features, either alone or in combination.

The example probe may include a probe card comprising a circuit board. The outer shroud and the inner structure may be arranged relative to the probe card. The inner structure may comprise one or more springs between the inner structure and the outer shroud to enable the outer shroud to move relative to the inner structure. The inner structure may comprise one or more springs between the outer shroud and the probe card to enable the outer shroud to move relative to the probe card. The example probe may comprise posts on which the outer shroud is mounted to enable to outer shroud to move relative to the probe card.

The electrical contacts of the example probe may comprise pins for making the electrical connection to the exposed electrical leads. The electrical connection between the pins and the exposed electrical leads may be achieved without bending the exposed electrical leads. The example probe may include a probe card comprising electrical circuitry. The electrical connection may create a signal path between the target device and the electrical circuitry.

The coarse alignment feature may comprise one or more chamfers, each of which may have a slanted surface that slopes downwardly towards the interior of the outer shroud. The fine alignment feature may comprise one or more chamfers having slanted surfaces that slope downwardly towards the electrical contacts. The slanted surfaces of the fine alignment feature may be shorter in length along the direction of movement of the target device than the slanted surfaces of the coarse alignment feature. The coarse alignment feature may comprise multiple chamfers, each which may have a slanted surface that slopes downwardly towards the interior of the outer shroud. The outer shroud may have opening in which to receive the target device. The multiple chamfers may be arranged around at least part of the opening. The fine alignment feature may be downstream of the coarse alignment feature relative to a direction of movement of the target device.

An example probe for automatic test equipment (ATE) may comprise the following features: a probe card comprising electrical circuitry; and a connection device comprising a coarse alignment feature, a fine alignment feature, and electrical contacts electrically connectable to the electrical circuitry. The coarse alignment feature may be configured to receive a target device and to guide the target device towards the fine alignment feature. The fine alignment feature may be configured to receive the target device and to guide the target device towards the electrical contacts. The electrical contacts may be to establish an electrical connection to exposed leads on the target device. At least part of the connection device may be movable relative to the probe card. The example probe may include one or more of the following features, either alone or in combination.

The coarse alignment feature may comprise one or more chamfers, each which may have a slanted surface that slopes downwardly towards an interior of the connection device. The fine alignment feature may comprise one or more chamfers having slanted surfaces that slope downwardly towards the electrical contacts. The slanted surfaces of the fine alignment feature may be shorter in length along the direction of movement of the target device than the slanted surfaces of the coarse alignment feature.

The electrical contacts of the probe may comprise pins for making the electrical connection to the exposed electrical leads. The electrical connection between the pins and the exposed electrical leads may be achieved without bending, substantially bending, or otherwise inflicting substantial damage to, the exposed electrical leads.

The at least part of the connection device that is movable relative to the probe card may include the coarse alignment feature. The at least part of the connection device that is movable relative to the probe card may be responsive to force applied by the target device to the coarse alignment feature. The target device may have substantially a same size as the connection device.

An example method of establishing a connection between a target device and a probe card may comprise the following operations: receiving the target device at a course alignment feature, where the coarse alignment feature is for guiding the target device towards a fine alignment feature, and where the target device comprises exposed electrical leads; and receiving the target device at the fine alignment feature, where the fine alignment feature is for guiding the target device towards the electrical contacts to enable exposed leads on the device to make an electrical connection to electrical contacts. The coarse alignment feature is part of an outer shroud and the fine alignment feature is part of a structure inside the outer shroud. The outer shroud moves relative to the inner structure during movement of the target device. The example method may include one or more of the following features, either alone or in combination.

The electrical contacts may comprise pins for making the electrical connection to the exposed electrical leads. The electrical connection between the pins and the exposed electrical leads may be made without bending, substantially bending, or otherwise inflicting substantial damage to, the exposed electrical leads.

The coarse alignment feature may comprise one or more chamfers, each of which may have a slanted surface that slopes downwardly towards the interior of the outer shroud. The fine alignment feature may comprise one or more chamfers having slanted surfaces that slope downwardly towards the electrical contacts. The slanted surfaces of the fine alignment feature may be shorter in length along the direction of movement of the target device than the slanted surfaces of the coarse alignment feature.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Figure 1:
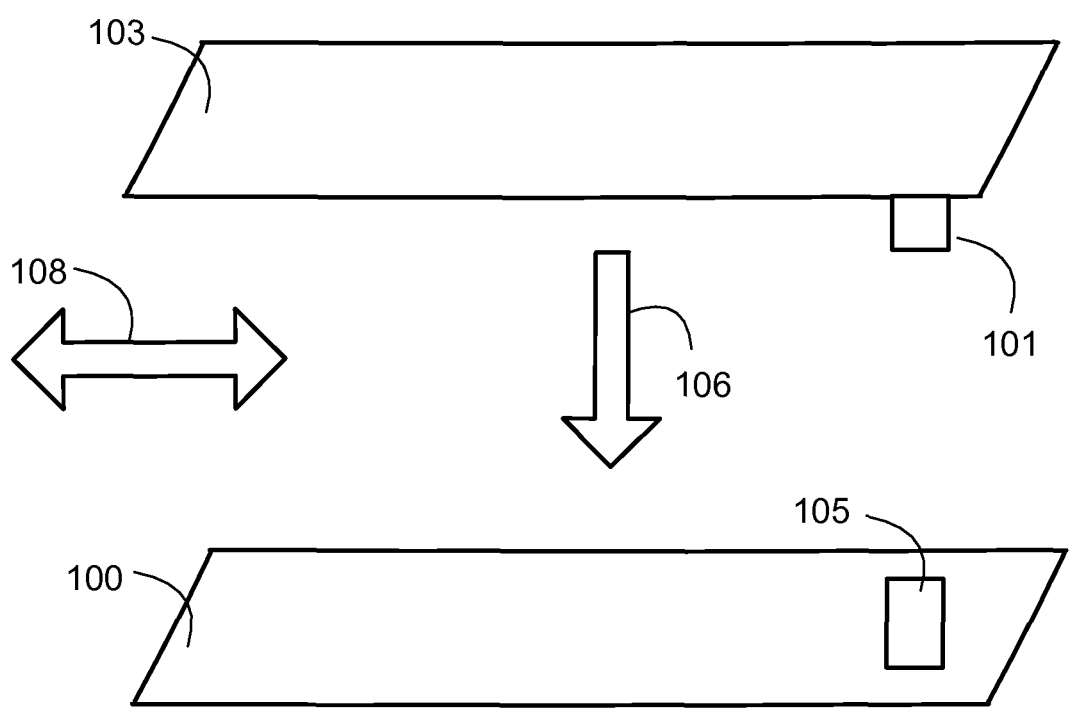
FIG. 1 is block diagram of an example test system showing a probe card and a device under test (DUT) in the process of connecting thereto.

To test components, manufacturers commonly use ATE (also referred to as "testers" or "test systems"). In an example ATE operation, in response to instructions in a test program set (TPS), ATE automatically generates input signals to be applied to a device under test (DUT), and monitors output signals from the DUT. The ATE compares the output signals with expected responses to determine whether the DUT is defective. ATE typically includes a computer system and a test instrument or a single device having corresponding functionalities. In some cases, the test instrument provides power to a DUT.

ATE may be used to test any appropriate type of DUT including, but not limited to, electrical or electro-mechanical device. For example, ATE may be used to test solid state drives (SSDs), hard drives, digital logic, analog logic, other types of memory devices, and so forth. In some examples, a probe may be part of the ATE used to test a DUT. The probe may be used to connect to the DUT, to send signals to the DUT, and to receive signals from the DUT. An example probe may include a connection device to electrically connect to exposed leads on the DUT to enable sending and receiving test signals to/from the DUT.

In this example, the connection device is used to establish an electrical and mechanical connection between the probe and the DUT. In this regard, the probe may include a probe card containing electrical circuitry, e.g., test circuits and/or circuit paths or leads to test electronics that are on, or off of, the probe card. The connection device may include pins that are connected to this electrical circuitry on the probe card. The pins also electrically connectable to exposed leads on the DUT. Through resulting electrical connections, the pins form an electrical pathway between the DUT and test electronics. This is described in more detail below.

In some cases, the DUT may be, or may be part of, a printed circuit board (PCB). For example, the PCB may include a connector having exposed leads, although the probe described herein is not limited to use with a PCB or connector. Rather, the DUT may be any appropriate testable structure containing one or more exposed leads that can connect electrically to the example connection device described herein. In some cases, the surface of the DUT may be irregular. For example, a PCB may have multiple, irregular structures mounted thereon, resulting in an irregular surface. The example connection device described herein enables electrical connection between the probe and a PCB of this type despite irregularities in the surface structure of the PCB.

In some implementations, the probe is stationary and the DUT is moved into contact with the probe. In some implementations, the DUT is stationary and the probe is moved into contact with the DUT. The concepts described herein apply equally to both of these configurations. The example below describes a case where the probe is stationary and the DUT is moved into contact with the probe.

FIG. 1 shows, conceptually, an example configuration in which a probe 100 is stationary and a DUT is moved into contact with the probe. In this example, the "DUT" may be a connector on PCB 103 or it may be the entire PCB itself or individual component(s) thereof (depending on what is being tested). For the sake of illustration, in the following description, the PCB is referred to as the DUT, and a connector on the PCB is referred to as the target device.

Probe 100 includes, among other features (not shown), a connection device 105 for electrically and mechanically connecting to a target device 101 on the DUT. In this example, the target device is a connector having exposed leads; however, the target device is not limited to being a connector. As shown in FIG. 1, the DUT is moved along the direction of arrow 106 so that target device 101 on the DUT mates to connection device 106 on the probe. The mating is described in more detail below, along with an example structure of the connection device.

In some implementations, either one, or both, of the DUT and the probe are movable laterally (e.g., in a direction of arrow 108) to facilitate mating of the DUT to the probe. That is, during mating, there may not be precise vertical alignment of the target device and the connection device. Accordingly, when the target device and the connection device come into mechanical contact, one or both of these devices may move enough laterally to compensate for any imprecision in vertical alignment, and thereby enable connection.

Figure 2:
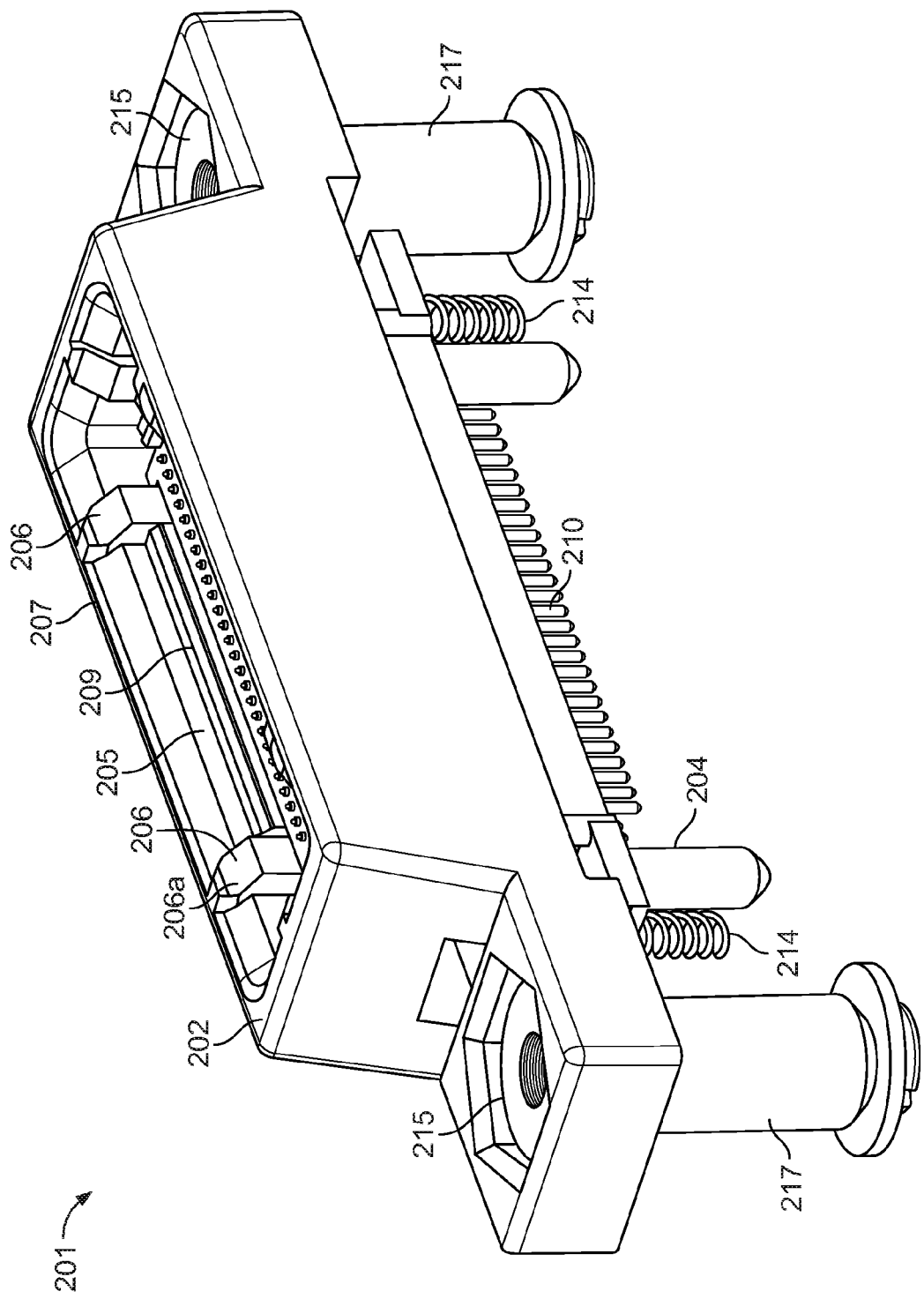
FIG. 2 is a side perspective view of an example connection device for use in connecting a DUT to a probe card.
Figure 3:
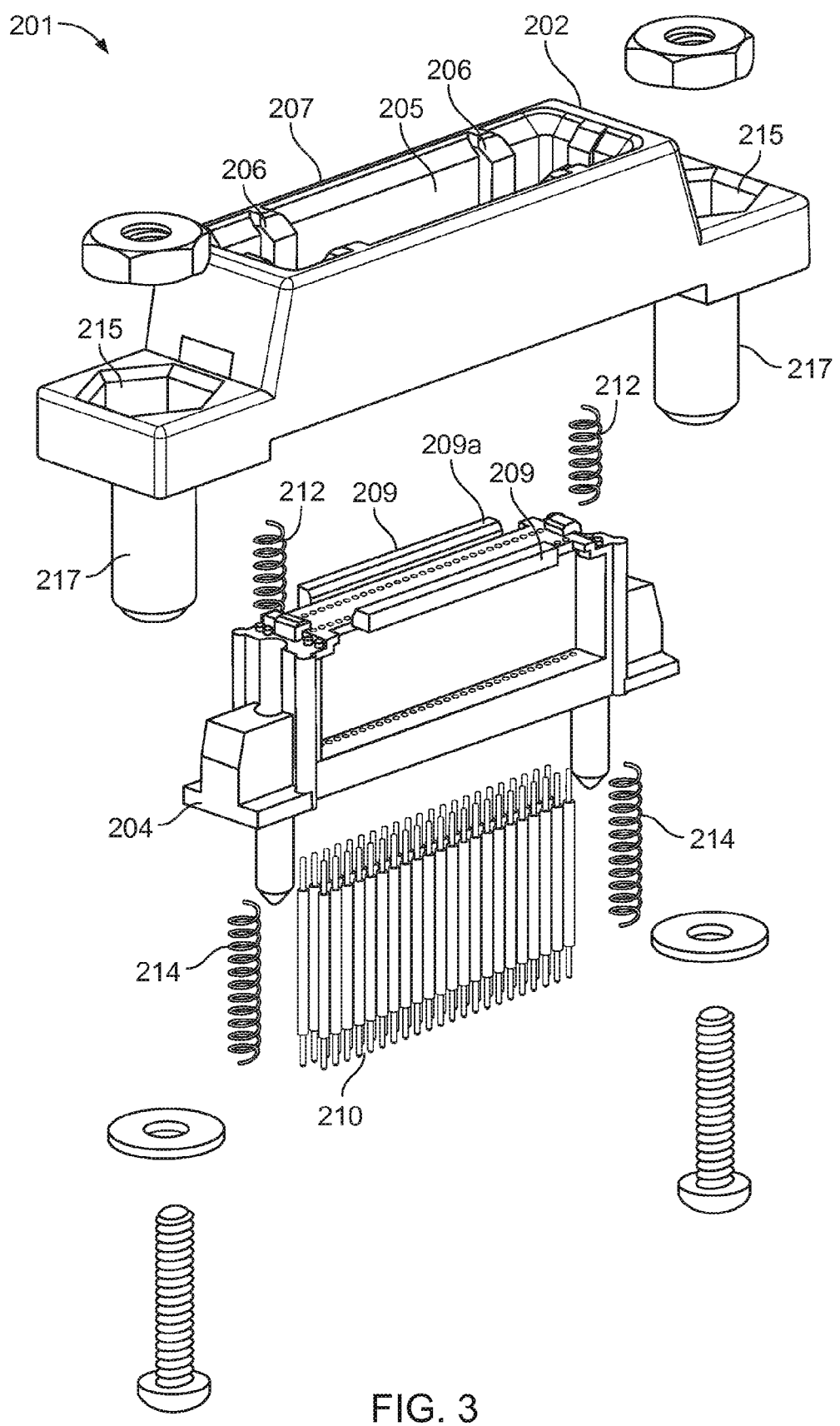
FIG. 3 is an exploded perspective view of the example connection device for use in connecting a DUT to a probe card.
Figure 4:
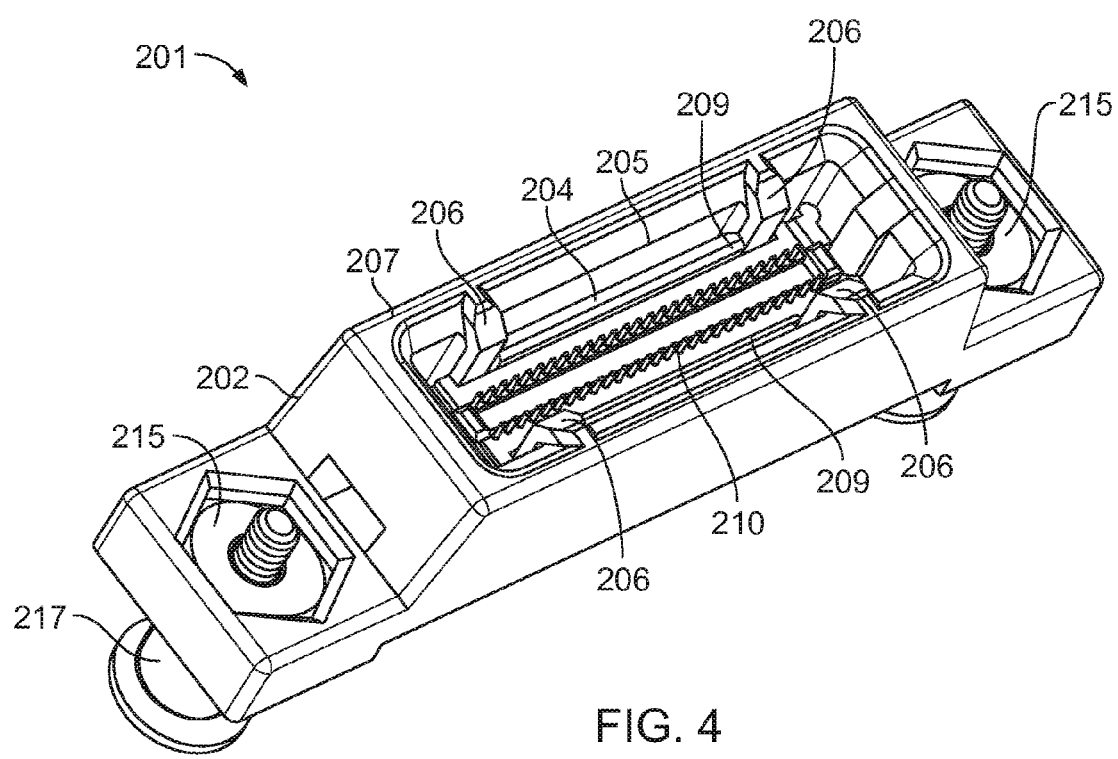
FIG. 4 is a top perspective view of the example connection device for use in connecting a DUT to a probe card.

FIGS. 2 to 4 show an example implementation of a connection device 201 that may be used in the configuration of FIG. 1. FIG. 3 shows components of example connection device 201 in an exploded view. Referring to FIGS. 2 to 4, connection device 201 includes an outer shroud 202 and an inner structure 204. At least part of inner structure 204 is inside of outer shroud 202 during use of the connection device. Outer shroud 202 includes an opening 205 for receiving a target device (e.g., a connector having exposed leads). Outer shroud also includes alignment features 206 arranged along the opening, e.g., around its interior edge. In this example, there are four such alignment features, two on each side of edge 207. In some implementations, there may be one, two three, five, six, etc. alignment features. In some implementations, the number, locations, sizes, and/or shapes of the alignment features may be different than those shown in FIGS. 2 to 4.

Alignment features 206, in this example, include chamfers having slanted surfaces (e.g., slanted surface 206a) that slope downwardly towards the interior of outer shroud 202 and towards additional alignment features and electrical contacts (both described below) that are part of the connection device. Alignment features 206 are so configured in order to guide the target device towards the interior of outer shroud 202 and, thus, towards the additional alignment features and electrical contacts to enable mating of the target device and the connection device.

Alignment features 206 are referred to as coarse alignment features in this example because those alignment features gather and guide the target device to a greater degree than the additional alignment features, which are part of inner structure 204, and which are referred to herein as fine alignment features to distinguish them from coarse alignment features 206. In this regard, the terms "coarse" and "fine" are relative terms and are not intended to have any specific limited meaning in terms of amount of alignment produced by each, but rather merely indicate that the alignment provided by the coarse alignment (e.g., movement resulting from guidance in response to applied force) is typically greater than the alignment provided by the fine alignment features.

Inner structure 204 includes fine alignment features 209, as shown in FIGS. 2 to 4. Fine alignment features 209 are downstream of coarse alignment features relative to movement of the target device during mating, and are within the outer shroud at least part of the time in some implementations. In this example, fine alignment features 209 include one or more chamfers having slanted surfaces (e.g., 209a shown in FIG. 3) that slope downwardly towards the electrical contacts. In some implementations, the slanted surfaces of the fine alignment feature are shorter in length along the direction of movement of the target device than the slanted surfaces of the coarse alignment features (e.g., since less travel is required for fine alignment). In some implementations, the coarse alignment features and the fine alignment features may have different configurations and arrangements than those described herein.

Outer shroud 202 fits slidably over inner structure 204 (and, thus, inner structure 204 fits within outer shroud 202), as shown in FIGS. 2 to 4. In this example implementation, the inner structure and the outer shroud are not fastened together, enabling the outer shroud to move relative to the inner structure and the probe card, as described in more detail below. Inner structure 204 includes electrical contacts 210. In this example, electrical contacts are pins, such as POGO® pins, that enable electrical connection to exposed leads without bending the exposed leads. Use of pins, such as POGO® pins, can be advantageous, since they may reduce the possibility of damage (e.g., bending) to electrical contacts of a DUT during testing.

Exposed leads on the target device (e.g., a connector) make electrical connection to the inner structure's electrical contacts, thereby creating an electrical path between the DUT, the connection device, and test electronics either on or off the probe card. In this regard, to enable the electrical connection, the outer shroud is configured to be movable relative to the inner structure and/or the probe card. For example, as shown in FIG. 3, connection device 201 may include springs 212 between inner structure 204 and outer shroud 202 (not shown in FIGS. 2 to 4), and springs 214 between outer shroud 202 and the probe card. The connection device also includes posts that enable movement of the outer shroud, as described below.

For example, in some implementations, the outer shroud includes holes 215, in which the posts are disposed, as shown in FIGS. 2 and 4. In some implementations, posts 217 may be fixed in holes 215 (e.g., using screws and washers) so that outer shroud 202 does not move relative to the posts. In some implementations, posts 217 may be mounted in holes 215 so that outer shroud 202 is movable along the posts. In any case, the posts are mounted in corresponding holes in the probe card. In a case where the posts are fixed in the holes so that the outer shroud does not move relative to the posts, the post are movably mounted in the probe card holes, so as to allow movement of the outer shroud relative to the inner structure and the probe card. That is, the posts, with the outer shroud fixed thereto, move within the holes in the probe card, thereby causing the outer shroud to move relative to the inner structure (which may be fixed to the probe card and immobile or substantially immobile). In a case where the posts are mounted in the holes in the probe card so that the outer shroud is movable along the posts, the posts are fixed (e.g. fastened) to the probe card (and thus are not movable themselves), and the outer shroud moves along the posts. That is, with the posts fixed, the outer shroud moves along the posts relative to the inner structure. In both example implementations, the springs restrict movement, and enable controlled movement of the outer shroud. In some implementations, the inner structure may be movable relative to the probe card, and its movement in response to downward force in such implementations causes its electrical contacts to electrically connect to corresponding electrical contacts (not shown) on the probe card.

Figure 5:
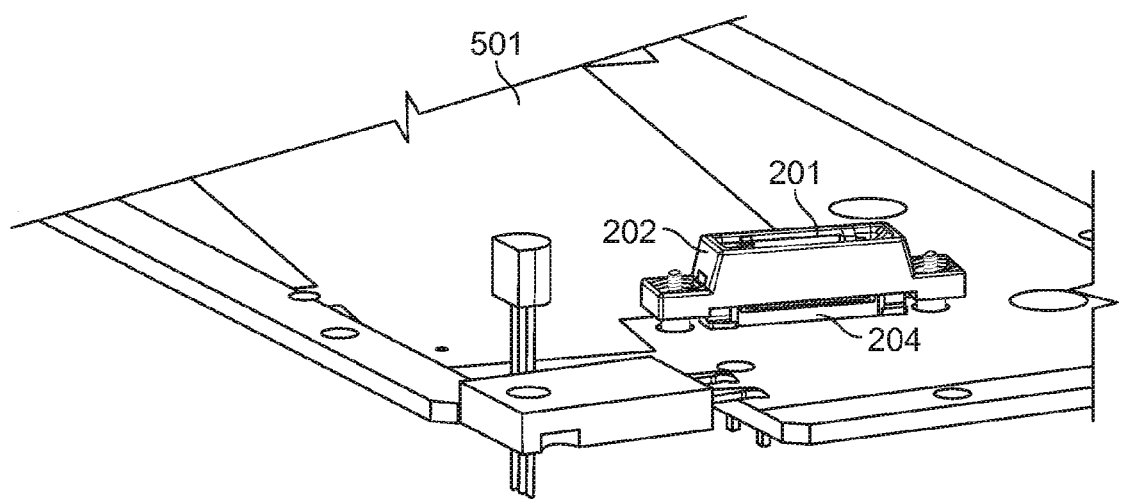
FIG. 5 is a perspective view of the example connection device mounted onto a probe card of ATE, in which only part of the probe card is shown.

As noted, in some implementations, inner structure 204 is mountable on a probe card 501, as shown, e.g., in FIG. 5. For example, as shown in FIG. 5, inner structure 204 is fastened to probe card 501, enabling electrical connection between electrical contacts 210 in the inner structure and electrical circuitry (not shown) on the probe card. Outer shroud 202 is movable mounted relative to the inner structure to enable engagement, and thus, electrical connection, between exposed electrical leads on the target device of a DUT (not shown in FIG. 5) and electrical contacts 210.

In this regard, referring to FIGS. 1 to 5, in operation, a target device comes into contact with opening 205 of outer shroud 202 and coarse alignment features 206 arranged thereon. In some cases, there may be an amount of lateral movement of the target device or the probe card so that there is better alignment between the opening and the target device. The target device thereafter engages with coarse alignment features 206. In this example, the target device is brought downward, from above, into contact with connection device 201; accordingly, downward force on the target device causes the target device to interact with the slanted/sloped surfaces of the coarse alignment features. In response to further downward force, coarse alignment features 206, by virtue of their downwardly-sloped shape, gather the target device and guide the target device downward towards an interior of the outer shroud, and thus towards fine alignment features 209 and electrical contacts 210 of inner structure 204. In this regard, electrical contacts 210 may be configured beforehand so that they have an arrangement that corresponds to, and will mate with, exposed electrical leads on the target device.

In response to additional downward force, the target device is forced past coarse alignment features 206 towards, and eventually into contact with, fine alignment features 209. At some point during movement, the target device, or another part of the DUT, contacts outer shroud 202, causing outer shroud 202 to move downwardly relative to inner structure 204 and the probe card, and along with the movement of the target device. That is, the downward force causes the outer shroud to move downwardly so as not to be an impediment to the exposed leads of the target device connecting to electrical contacts 210 of inner structure 204.

In response to further downward force, fine alignment features 209, by virtue of their downwardly-sloped shape, gather the target device and guide the target device downward further into the interior of the outer shroud 202, and thus further towards electrical contacts 210 of inner structure 204. Typically, although not necessarily, the amount of guidance provided by fine alignment features 209 is less than that provided by coarse alignment features 206. Thus, the combined effects of the coarse alignment features and the fine alignment features cause the exposed leads of the target device to substantially align to corresponding electrical contacts (e.g., POGO® pins) of inner structure 204 before those exposed leads actually engage with/connect to those contacts. Outer shroud 202 also continues its downward movement. The springs associated with the outer shroud may be calibrated to enable an appropriate amount of downward movement.

At some point, in response to an appropriate amount of force, which may differ for different connection devices, different DUTs, different circumstances, etc., the exposed electrical leads of the DUT (e.g., leads of a connector at, on, or to the DUT) electrically connect to corresponding electrical contacts 210 of inner structure 204. This creates a circuit between the DUT and test electronics on, or off, the probe card, through which electrical signals may pass. As noted, in some implementations, the electrical connection is established without bending either the electrical leads of the DUT or electrical contacts 210 of the connection device. In some implementations, there may be some tolerable amount physical damage or deformity due to bending or the like, depending on the configurations of the exposed leads and/or the type(s) of electrical contacts used.

In some implementations, the connection device may have any appropriate dimensions, and is not limited to any particular size. In some implementations, the connection device is usable with probes having pitches as low as 0.35 mm; however, in other implementations, different pitches are usable that are either above or below this value of 0.35 mm, e.g., 1 mm, 0.5 mm, and so forth. Also, the connection device may be used with any appropriate test equipment or appropriate other circuitry that is not used for, or part of, ATE or any other test system. In some implementations, the connection device is sized to match a size of the target device or DUT; however, this is not a requirement.

Figure 6:
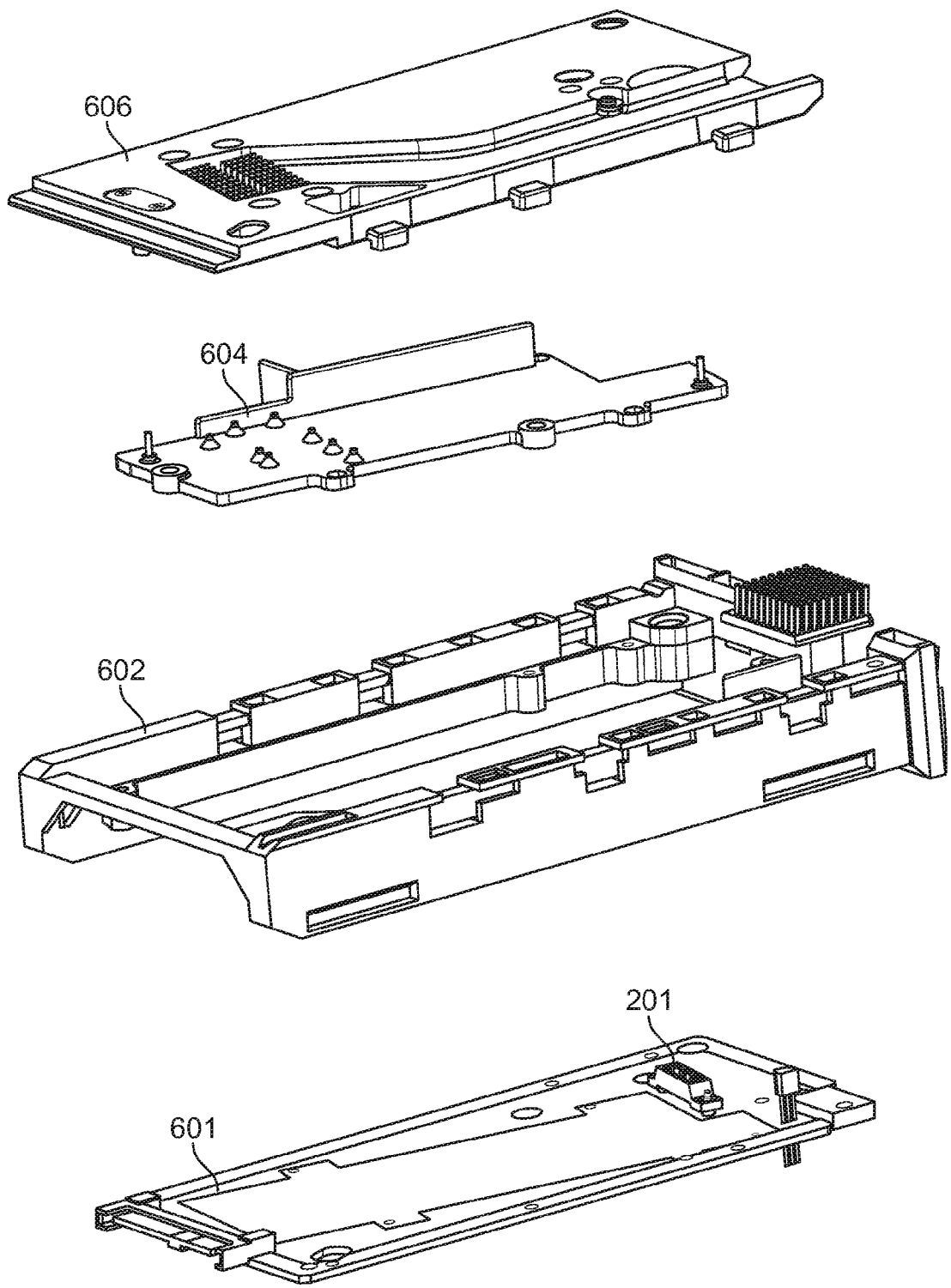
FIG. 6 is an exploded perspective view of components of example ATE for use in testing solid state drives, which includes the connection device.

As noted above, the example connection device described herein may be used in ATE configured to test solid state drives (SSDs). An example solid state drive does not include a spinning disk, but instead employs integrated circuit assemblies as memory for persistent storage of data. FIG. 6 shows an exploded view of components of example ATE that may be used to test SSDs.

In the example implementation of FIG. 6, example connection device 201 is mounted to probe card 601. Probe card 601 is mounted to the bottom of tray 602, which receives a DUT (here, the SSD under test—not shown). In the manner described above, a connector having exposed leads mates to connection device 201, thereby creating an electrical circuit between the probe card and the DUT. In some cases, a plate 604 may be incorporated into tray 602 and on top of at least part of probe card 601. Plate 604 may be used to maintain the horizontal orientation of the DUT in the tray relative to the probe card, and thereby assist in establishing the electrical connection. In this example, the tray is on top of the probe card, and the DUT is mounted on top of the tray and the probe card so that its connector mates to connection device 201. Cover 606 fits atop tray 602 to enclose the DUT for testing.

As explained elsewhere herein, the example connection device described herein is not limited to testing SSDs, and may be used in testing any appropriate electrical or electromechanical device. In this regard, the connection device is not limited to use in a test context, but rather may be used to establish electrical connection between any two appropriate devices for any appropriate purpose.

Thus, in the example implementations described herein, the connection device fine-aligns a probes directly to an irregular target. The connection device also provides gather and compliance to fine-align the irregular target beginning with PCB alignment features. The outer shroud of the connection device provides sufficient gather to capture the irregular target and to gather it to the inner fine alignment features of the probe block. The outer shroud is spring loaded allowing it to retract. This retraction allows for a greater coarse alignment gather zone than allowed by the height of the irregular target. The spring loading of the shroud also enables a particular sequence of alignment. The shroud first coarse-aligns the target to the fine alignment features of the probe block before those features engage the target. The fine-alignment features also engage the target before contact is made by the probes, reducing damage to the probe.

Figure 7:
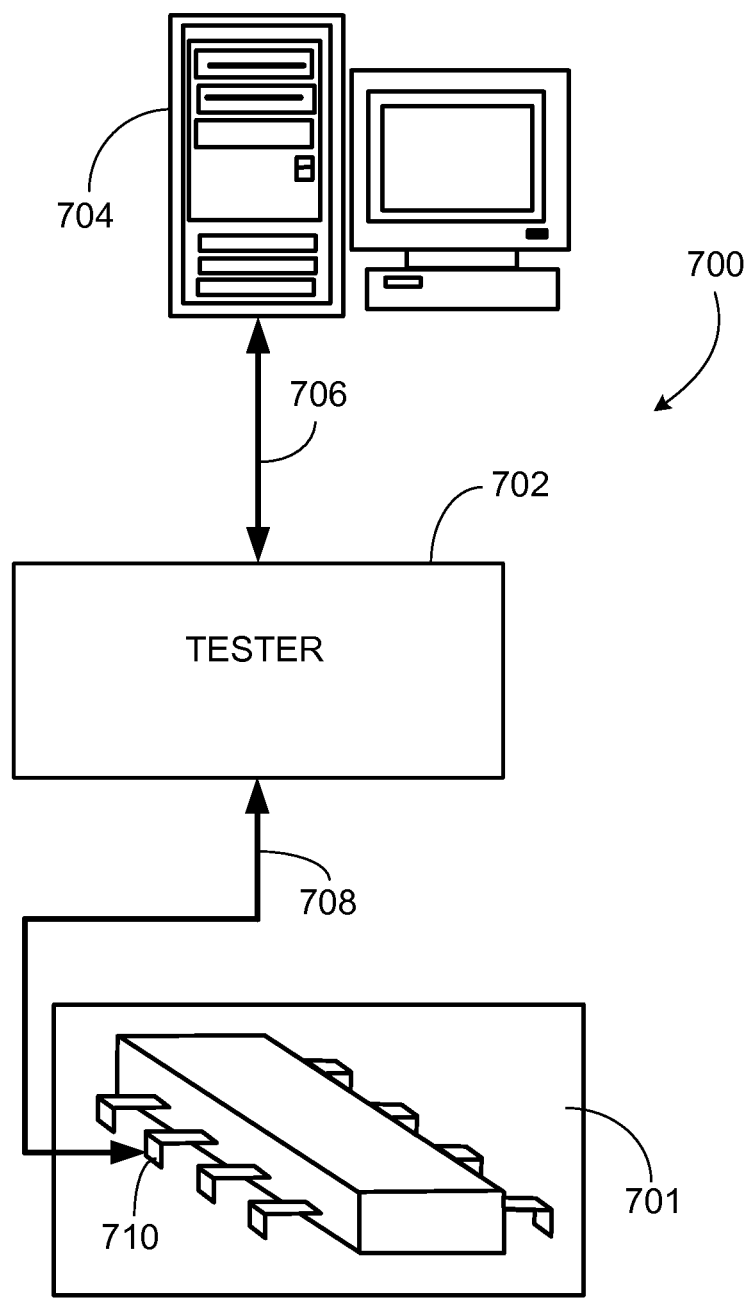
FIG. 7 is a block diagram of additional example components of the ATE.

Referring to FIG. 7, an example ATE system 700 for testing a DUT 701, may include a connection device of the type described with respect to FIGS. 1 to 6.

Tester 702 may include a number of channels. To control tester 702, system 700 includes a computer system 704 that interfaces with tester 702 over a hardwire connection 706. In an example operation, computer system 704 sends commands to tester 702 to initiate execution of routines and functions for testing DUT 701. Such executing test routines may initiate the generation and transmission of test signals to the DUT 701 and collect responses from the DUT. Various types of DUTs may be tested by system 700. For example, DUTs that may be tested include, but are not limited to, an SSD, an electric motor, one or more components thereof, an integrated circuit (IC) chip (e.g., memory chip, microprocessor, analog-to-digital converter, digital-to-analog converter, etc.) or other appropriate devices.

To provide test signals and collect responses from the DUT, tester 702 is connected to an interface to the internal circuitry of DUT 701. The interface may include the interface device described with respect to FIGS. 1 to 6. A conductor 708 (e.g., one or more conductive pathways) passes through the interface and is used to deliver test signals (e.g., switching or DC test signals, etc.) to the internal circuitry of DUT 701. Conductor 706 also senses signals in response to the test signals provided by tester 702. For example, a voltage signal or a current signal may be sensed at pin 710 in response to a test signal and sent over conductor 706 to tester 702 for analysis. Such single port tests may also be performed on other pins included in DUT 701. For example, tester 702 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 706 to pin 710 for storing a digital value on DUT 701. Once stored, DUT 701 may be accessed to retrieve and send the stored digital value over conductor 706 to tester 702. The retrieved digital value may then be identified to determine if the proper value was stored on DUT 701.

Along with performing single port measurements, a two-port or multi-port test may also be performed by tester 702. For example, a test signal may be injected over conductor 706 into pin 710 and a response signal may be collected from one or more other pins of DUT 701. This response signal may be provided to tester 702 to determine quantities, such as gain response, phase response, and other throughput measurement quantities. Other tests may also be performed.

While this specification describes example implementations related to "testing" and a "test system," the devices and methods described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more non-transitory machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A probe for automatic test equipment (ATE) comprising:
    an outer shroud comprising an opening, the opening having an interior edge, the interior edge comprising a coarse alignment feature configured to receive a target device and to guide the target device through the opening into an interior of the outer shroud, the target device comprising exposed electrical leads; and
    an inner structure that is at least partly inside the outer shroud, the inner structure comprising electrical contacts for making an electrical connection to the exposed electrical leads, the inner structure comprising a fine alignment feature configured to guide the target device towards the electrical contacts to make the electrical connection, the fine alignment feature being entirely within the outer shroud during at least part of the time during mating to the target device;
    wherein the outer shroud is movable relative to the fine alignment feature to enable contact between the electrical contacts and the exposed electrical leads.

2. The probe of claim 1, further comprising:
    a probe card comprising a circuit board, the outer shroud and the inner structure being arranged relative to the probe card, the inner structure comprising one or more springs between the inner structure and the outer shroud to enable the outer shroud to move relative to the inner structure.

3. The probe of claim 2, wherein the inner structure comprises one or more springs between the outer shroud and the probe card to enable the outer shroud to move relative to the probe card.

4. The probe of claim 2, further comprising posts on which the outer shroud is mounted to enable to outer shroud to move relative to the probe card.

5. The probe of claim 1, wherein the electrical contacts comprise pins for making the electrical connection to the exposed electrical leads.

6. The probe of claim 5, wherein the electrical connection between the pins and the exposed electrical leads is achieved without bending the exposed electrical leads.

7. The probe of claim 5, further comprising:
a probe card comprising electrical circuitry, the electrical connection creating a signal path between the target device and the electrical circuitry.

8. The probe of claim 1, wherein the coarse alignment feature comprises one or more chamfers, each of the chamfers having a slanted surface that slopes downwardly towards the interior of the outer shroud.

9. The probe of claim 8, wherein the fine alignment feature comprises one or more chamfers having slanted surfaces that slope downwardly towards the electrical contacts, the slanted surfaces of the fine alignment feature being shorter in length along the direction of movement of the target device than the slanted surfaces of the coarse alignment feature.

10. The probe of claim 1, wherein the fine alignment feature is downstream of the coarse alignment feature relative to a direction of movement of the target device.

11. The probe of claim 1, wherein the coarse alignment feature comprises multiple chamfers, each of the chamfers having a slanted surface that slopes downwardly towards the interior of the outer shroud, the outer shroud having an opening in which to receive the target device, the multiple chamfers being arranged around at least part of the opening.

12. A probe for automatic test equipment (ATE) comprising:
a probe card comprising electrical circuitry; and
a connection device comprising:
an outer shroud comprising an opening, the opening having an interior edge, the interior edge comprising a coarse alignment feature;
a fine alignment feature; and
electrical contacts electrically connectable to the electrical circuitry;
the coarse alignment feature to receive a target device and to guide the target device through the opening towards an interior of the outer shroud and towards the fine alignment feature, the fine alignment feature to receive the target device and to guide the target device towards the electrical contacts, the electrical contacts to establish an electrical connection to exposed leads on the target device, the fine alignment feature being entirely within the outer shroud during at least part of the time during mating with the target device, the outer shroud being movable relative to the fine alignment feature to enable contact between the electrical contacts and the exposed electrical leads.

13. The probe of claim 12, wherein the coarse alignment feature comprises one or more chamfers, each of the chamfers having a slanted surface that slopes downwardly towards an interior of the connection device.

14. The probe of claim 13, wherein the fine alignment feature comprises one or more chamfers having slanted surfaces that slope downwardly towards the electrical contacts, the slanted surfaces of the fine alignment feature being shorter in length along the direction of movement of the target device than the slanted surfaces of the coarse alignment feature.

15. The probe of claim 12, wherein the electrical contacts comprise pins for making the electrical connection to the exposed electrical leads.

16. The probe of claim 15, wherein the electrical connection between the pins and the exposed electrical leads is achieved without bending the exposed electrical leads.

17. The probe of claim 12, wherein the outer shroud is responsive to force applied by the target device to the coarse alignment feature.

18. The probe of claim 12, wherein the target device has substantially a same size as the connection device.

19. A method of establishing a connection between a target device and a probe card, the method comprising:
receiving the target device at an outer shroud comprising an opening, the opening having an interior edge, the interior edge comprising a coarse alignment feature, the coarse alignment feature guiding the target device through the opening towards a fine alignment feature, the target device comprising exposed electrical leads;
receiving the target device at the fine alignment feature, the fine alignment feature guiding the target device towards electrical contacts to enable the exposed electrical leads on the target device to make an electrical connection to the electrical contacts;
wherein the fine alignment feature is part of a structure inside the outer shroud, the outer shroud moving relative to the fine alignment feature during movement of the target device, the fine alignment feature being entirely within the outer shroud during at least part of the time during mating with the target device.

20. The method of claim 19, wherein the electrical contacts comprise pins for making the electrical connection to the exposed electrical leads; and
wherein the electrical connection between the pins and the exposed electrical leads is made without bending the exposed electrical leads.

21. The method of claim 19, wherein the coarse alignment feature comprises one or more chamfers, each of the chamfers having a slanted surface that slopes downwardly towards the interior of the outer shroud; and
wherein the fine alignment feature comprises one or more chamfers having slanted surfaces that slope downwardly towards the electrical contacts, the slanted surfaces of the fine alignment feature being shorter in length along the direction of movement of the target device than the slanted surfaces of the coarse alignment feature.

* * * * *